United States Patent [19]

Tasch, Jr.

[11] 4,373,165

[45] Feb. 8, 1983

[54] VERY HIGH DENSITY PUNCH-THROUGH READ-ONLY-MEMORY

[75] Inventor: Al F. Tasch, Jr., Richardson, Tex.

[73] Assignee: Texas Instruments Incorporated, Dallas, Tex.

[21] Appl. No.: 301,504

[22] Filed: Sep. 14, 1981

Related U.S. Application Data

[63] Continuation of Ser. No. 92,241, Nov. 7, 1979, abandoned.

[51] Int. Cl.[3] ...................... H01L 29/90; H01L 27/10; G11C 17/06; G11C 11/36

[52] U.S. Cl. ........................................ 357/13; 357/45; 357/67; 365/105; 365/175

[58] Field of Search ..................... 357/13, 45; 365/105, 365/175

[56] References Cited

U.S. PATENT DOCUMENTS 4,254,427 3/1981 Lohstroh .............................. 357/13

OTHER PUBLICATIONS

Lohstroh et al "Punch-Through Cell for Dense Bipolar ROMS" IEEE Int. Solid-State Circuits Conf. (2/78), Dig. Technical Papers pp. 20–21.

*Primary Examiner*—Gene M. Munson

*Attorney, Agent, or Firm*—Robert Groover, III; Melvin Sharp; James T. Comfort

[57] ABSTRACT

A semiconductor read-only-memory (ROM) device having an array of punch-through devices as memory cells. The cells are formed at the crossing points of two pluralities of parallel elongated regions, the two pluralities being perpendicular to each other. One plurality is located in subsurface regions of a semiconductor body and is of a conductivity type opposite that of the surrounding body. The other plurality is located at a surface of the semiconductor body and is of the same conductivity type as the subsurface plurality. The device is programmed by implanting impurities of the same conductivity type as the semiconductor body between selected crossing points. No contacts exists in the array.

7 Claims, 5 Drawing Figures

VERY HIGH DENSITY PUNCH-THROUGH READ-ONLY-MEMORY

This is a continuation of application Ser. No. 092,241, filed Nov. 7, 1979, now abandoned.

BACKGROUND OF THE INVENTION

This invention is directed to high density semiconductor memories, and more particularly, to a high density read-only-memory device which uses punch-through devices as the memory cells.

Read-only-memory devices are smaller in size than random access memories for a given number of bits of information. Generally, a read-only-memory cell consists of a single transistor, either metal-oxide-semiconductor or bipolar depending on the particular technology. A single transistor device gives a very small memory element. Single bipolar transistor memory cells are described in, "Design Consideration for a High-Speed Bipolar Read Only Memory" by Barrett et al in IEEE Journal of Solid State Circuits, pp. 196–202, October, 1970. Even smaller read-only-memories have been developed which utilize Schottkey diodes. Such a device is shown in "A Bipolar 16K ROM Utilizing Schottkey Diode Cells" by Gunn and Pritchett, IEEE International Solid-State Circuits Conference Digest of Technical Papers, pp. 118–119, February, 1977. A new type of memory cell which is even smaller than the Schottkey diode cell is the punch-through memory cell. This cell conducts current when a voltage is applied between adjacent impurity regions such that the depletion region from one of the impurity regions reaches the other impurity region. Such a device has been described in "Punch-Through Cell for Dense Bipolar ROMs" by Lohstroh and Slob, IEEE International Solid-State Circuits Conference Digest of Technical Papers, pp. 20–21, February, 1978. The punch through device is very fast because current flow is by drift rather by diffusion. The cell of Lohstroh in Slob is still larger than necessary because of the existence of contacts in the memory array.

SUMMARY OF THE INVENTION

The invention is embodied in a semiconductor read-only-memory device. The device is formed in a semiconductor substrate by first diffusing or implanting impurities of a conductivity type opposite the substrate in a plurality of elongated parallel regions in the substrate surface. An epitaxial layer of the same conductivity type as the substrate is then grown upon the substrate surface leaving the plurality of elongated regions embedded in a semiconductor body so as to be below the new surface of the substrate. A plurality of parallel elongated regions of a conductivity type opposite the substrate and perpendicular to the subsurface plurality is formed in the surface of the epitaxial layer. In a second embodiment platinum silicide regions are formed in the surface plurality to minimize resistances. The memory cells consist of punch through devices which are formed at the points where the pluralities cross. When a large enough potential is applied between crossing pluralities, the depletion region from one plurality will reach the other plurality and conduction will occur. Implanted regions of a conductivity type the same as the substrate are placed between the pluralities at selected crossing points to program the memory by preventing conduction at the crossing points. The speed of the punch through device is very fast because current conduction is by drift rather than by diffusion. No contacts exists in the memory array giving a maximum density device.

BRIEF DESCRIPTION OF THE DRAWINGS

The novel features believed characteristic of the invention are set forth in the appended claims. The invention itself, however, as well as other features and advantages thereof will be best understood by reference to the detailed description which follows, read in conjunction with the accompanying drawings, wherein:

Figure 1:
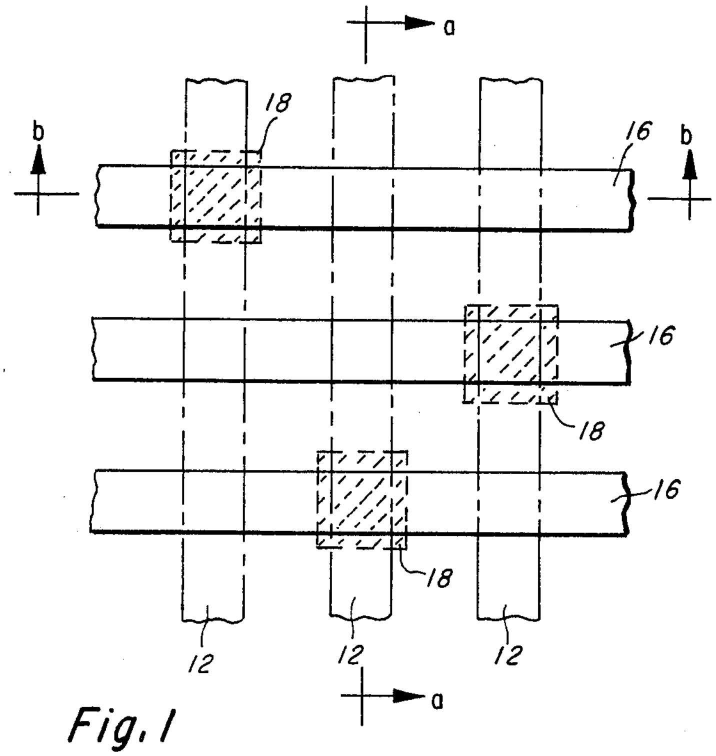
FIG. 1 is a greatly enlarged plan view of a small portion of a semiconductor chip showing the physical layout of an array of ROM cells.
Figure 2A:
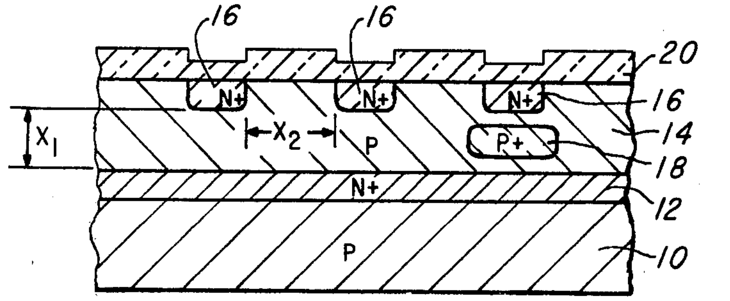
Figure 2B:
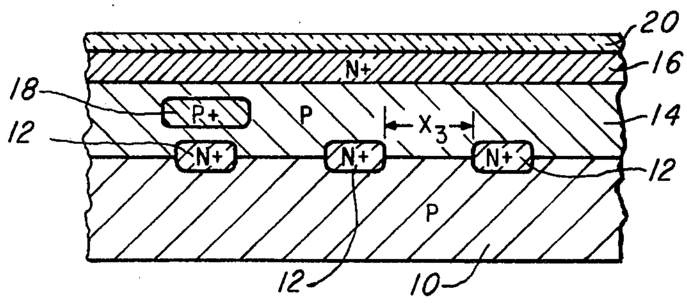
Figure 3A:
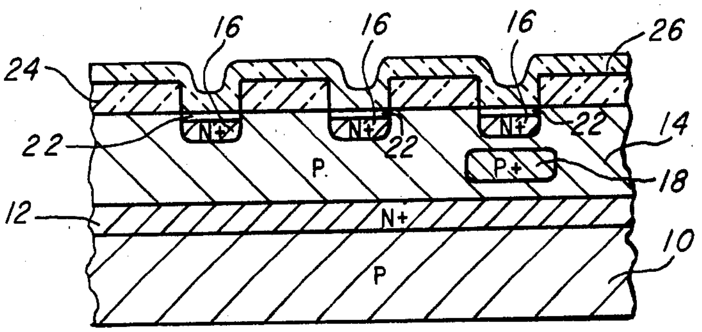
Figure 3B:
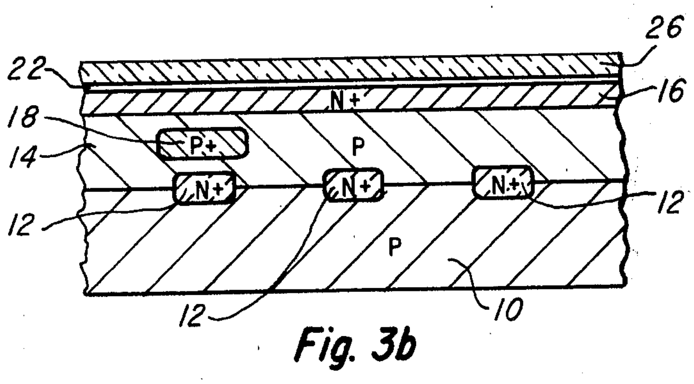

FIGS. *2a–2b* are elevation views in section of the cells of FIG. 1, taken along the lines a—a and b—b respectively, showing one embodiment of the invention; and FIGS. *3a–3b* are elevation views in section of the cells of FIG. 1, taken along the lines a—a and b—b respectively, showing another embodiment of the invention.

DETAILED DESCRIPTION OF THE INVENTION

Referring to FIG. 1, a physical layout of an array of ROM cells of the invention is shown. The array is, of course, greatly enlarged in FIG. 1 as each cell would occupy less than one square mil. The surface plurality 16 is represented by the solid lines. The subsurface plurality 12 is represented by the short and long dashed lines. The sectioned areas 18 represent the subsurface implanted regions 18 between crossing points of the pluralities 12, 16. The subsurface implanted regions 16 serve to program the device.

Referring to FIGS. *2a–2b*, sectional views of the memory cells of FIG. 1 show the details of construction of a first embodiment of the invention. The device is formed in a substrate 10 of p-type silicon. A plurality of parallel elongated doped regions (subsurface plurality) 12 of a conductivity type opposite that of the substrate 10 is formed in surface regions of the substrate 10. An epitaxial layer 14 of the same conductivity type as the substrate 10 lies upon the substrate 10 and serves to embed the subsurface plurality 12 in a body of silicon. A plurality of parallel elongated doped regions (surface plurality) 16 of the conductivity type opposite the substrate 10 lies in surface regions of the epitaxial layer 14 perpendicular to the subsurface plurality 12 and spaced therefrom to form a criss-cross pattern. A plurality of subsurface regions 18 of the same conductivity type as the substrate 10 lies in the epitaxial layer 14 at selected crossing points of the surface and subsurface parallel pluralities 16, 12. The subsurface regions 18 act to program the memory. An insulating layer 20 of silicon dioxide covers the epitaxial layer 14 and the surface plurality 16.

Referring to FIGS. *3a–3b*, sectional views of the memory cells of FIG. 1 show the details of construction of a second embodiment of the invention. The elements is FIGS. *3a–3b* that are the same as the elements in FIGS. *2a–2b* are designated with the same reference numerals as used in FIGS. *2a–2b* with the addition of an "A" subscript. Therefore, the description of FIGS. *2a–2b* is applicable to FIGS. *3a–3b* with the following changes. Metal silicide regions 22 of platinum silicide lie in surface regions of the surface plurality of parallel elongated regions 16A. A layer 24 of silicon dioxide lies upon the epitaxial layer 14A but does not cover the surface plurality 16A. An insulating layer 26 comprising silicon dioxide lies upon the layer 24 of silicon dioxide and the surface plurality 16A.

Referring to FIGS. *2a–2b* a process for making the ROM cells of FIG. 1 is described. The starting material is a p-type monocrystalline silicon substrate 10 cut on the <111> orientation and having a resistivity of greater than 2 ohm-cm, preferably 10 ohm-cm. A layer of silicon dioxide is thermally grown upon the slice and patterned leaving areas of the substrate 10 exposed where the subsurface plurality 12 is to be formed. The slice is subjected to an arsenic implant dose of $5\times10^{15}-5\times10^{16}$ ions/cm$^2$ at 100–200 KeV, preferably $1\times10^{16}$ ions/cm$^2$ at 150 KeV. The slice is then annealed in an inert atmosphere at 700°–900° C. for 20–40 minutes, preferably 800° C. for 30 minutes. After anneal, the oxide layer is stripped from the slice and a p-type epitaxial layer 14 is grown upon the slice. The epitaxial layer 14 is of 1–4 micrometers thickness and 0.3–8 ohm-cm resistivity, preferably 2 micrometers and 4 ohm-cm. The slice is then subjected to a boron channel stop implant at a dose of $0.3-1.0\times10^{12}$ ions/cm$^2$ at 50 KeV. The channel stop prevents parasitic transistor action between adjacent doped regions of the surface plurality. A layer of photoresist is then applied and patterned leaving silicon exposed where the programming implant is desired. The photoresist is the implant mask. The slice is then subjected to a boron implant at a dose of $1-2\times10^{12}$ ions/cm$^2$ at 100–400 KeV. The photoresist layer is removed and an insulating layer 20 of silicon dioxide is thermally grown upon the slice to a thickness of 2000–5000 Angstroms. A layer of photoresist is applied and patterned with the surface plurality pattern. Parts of the oxide layer 20 not covered with resist are removed by hydrofluoric acid etch. The slice is then subjected to an arsenic implant at $3.5\times10^{15}$ ions/cm$^2$ at 40–100 KeV to form the surface plurality 16, followed by the removal of the resist layer. The slice is then subjected to a steam atmosphere at 800°–1000° C. to grow oxide to a thickness of 2000–4000 Angstroms above the surface plurality 16 and to activate the arsenic implanted in the surface plurality 16. Photoresist is applied and patterned, and the oxide layer 20 etched to form contacts. The photoresist is removed and a layer of aluminum is evaporated and patterned to form device interconnections. This completes the process.

The process used to make the embodiment of FIGS. *3a–3b*, up through the step of implanting arsenic to form the surface plurality 16A, is the same as that used to make the embodiment of FIGS. *2a–2b*. The process step subsequent to the arsenic implant are as follows. After the implant, the photoresist is removed and the slice is annealed in an inert atmosphere to activate the implanted arsenic. A layer of platinum is sputtered upon the slice to a thickness of 100–1000 Angstroms, preferably 300 Angstroms. The slice is then annealed in an inert atmosphere at 350°–650° C., preferably 500° C. for 20 minutes to form the platinum slicide regions 22 in the surface plurality 16A. Next the slice is placed in an aqua regia etch to remove the platinum from areas where platinum silicide was not formed. An insulating layer 26 comprising silicon dioxide is deposited upon the slice to a thickness of 1500–4000 Angstroms, preferably 3000 Angstroms. The contacts and interconnections are then formed as in the embodiment of FIGS. *2a–2b*.

Although specific embodiments have been described, it is not intended that the invention be so limited. For example, the substrate 10 could be n-type silicon or other semiconductors, in which case the pluralities of parallel elongated regions 12, 16 would be p-type. It is possible to form the subsurface plurality 12 by a deep ion implant into the substrate and thereby eliminate the need for an epitaxial layer 14. The metal silicide regions 22 could be silicides such as titanium, molybdenum, tungsten, etc.. The insulating layer 26 could be polyimide or other insulators.

The ROM array is operated by applying a voltage differential between one of the surface parallel regions and one of the subsurface parallel regions. If there is no p-type implanted region at the crossing point between the surface and subsurface parallel regions where the voltage is applied current will flow between the two regions by the punch-through phenomena which will occur at a low voltage due to the absence of the p-type implant in the region between the two parallel regions. This can represent a ROM cell with a logic "1" state. If a p-type implanted region exists at the crossing point, no current will flow when there is a voltage differential between the two parallel regions. In this case the depletion region for the reverse biased parallel region will be blocked by the implanted region at the crossing point thereby preventing punch-through. This can represent a ROM cell with a logic "0" state. During the time a voltage differential exists between one of the surface parallel regions and one of the subsurface parallel regions, the remainder of the surface and subsurface parallel regions or at least one of the two groups of regions, are floating. This will prevent current flow between any other crossing points. As previously mentioned current flow is due to the punch-through phenomena which will occur if the distance $X_1$ between the surface parallel and subsurface parallel pluralities is sufficiently small and the epitaxial layer resistivity is sufficiently high. For example, if the distance between the surface parallel and subsurface parallel pluralities is 1.0 micrometers and the epitaxial layer doping concentration of $3.0\times10^{15}$ cm$^{-2}$ punch-through will occur when 4–5 volts is applied between the surface parallel and subsurface parallel pluralities. The spacing $X_2$, $X_3$ between each region of the surface parallel plurality and each region of the subsurface parallel plurality is such that no punch-through will occur between regions of the same plurality when the maximum chip voltage exists as a voltage differential between adjacent regions in the same plurality. The minimum spacing for $X_2$ and $X_3$ is 2.0–3.0 micrometers for an epitaxial layer doping concentration of $3.0\times10^{15}$ cm$^{-2}$ and $X_1$ of 1.0 micrometers.

One of the advantages of the structure is that no contacts are required in the array giving a smaller array and higher yield because of the elimination of problems associated with contacts. Another advantage is that there are no critical alignments in the array, not even the alignment for the programming implant. A further advantage is that packing density is maximum, thereby giving smaller chips and higher yield. A still further advantage is that the speed of the device will be high because current conduction is by drift rather than by diffusion. Still another advantage is that this high density ROM cell exploits a high density device phenomenon (punch-through) which is normally considered undesirable.

What is claimed is:

1. A semiconductor device comprising:

a body of monocrystalline semiconductor of one conductivity type having a plurality of parallel, elongated, surface regions of opposite conductivity type;

a plurality of elongated, subsurface parallel regions of opposite conductivity type, perpendicular to said surface plurality and spaced therefrom to form a criss-cross pattern; and a subsurface plurality of regions of said one conductivity type located between selected crossing points of said pattern, said respective subsurface regions each being more heavily doped than said body of monocrystalline semiconductor.

2. A semiconductor device according to claim 1 further including an insulating layer upon said device.

3. A semiconductor device according to claim 1 wherein said body and said subsurface plurality are p-type and said surface and subsurface parallel pluralities are n-type.

4. A semiconductor device according to claim 1 further including metal silicide regions in said surface parallel plurality.

5. A semiconductor device according to claim 4 further including an insulating layer upon said device.

6. A semiconductor device according to claim 4 wherein said body and said subsurface plurality are p-type and said surface and subsurface parallel pluralities are n-type.

7. A semiconductor device according to claim 4 wherein said metal silicide regions are platinum silicide.

* * * * *